(12) United States Patent
Li et al.

(10) Patent No.: US 11,703,534 B2
(45) Date of Patent: Jul. 18, 2023

(54) DETERMINING OF A POWER LINE FAULT

(71) Applicant: Hitachi Energy Switzerland AG, Baden (CH)

(72) Inventors: Youyi Li, Vasteras (SE); Jianping Wang, Vasteras (SE)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/460,994

(22) Filed: Aug. 30, 2021

(65) Prior Publication Data

US 2022/0065913 A1    Mar. 3, 2022

(30) Foreign Application Priority Data

Sep. 1, 2020   (EP) ..................................... 20193874

(51) Int. Cl.
     *G01R 31/08*      (2020.01)
     *H02H 7/26*      (2006.01)

(52) U.S. Cl.
     CPC ......... *G01R 31/085* (2013.01); *G01R 31/088* (2013.01); *H02H 7/26* (2013.01)

(58) Field of Classification Search
     CPC ....... H02H 7/26; G01R 31/085; G01R 31/088
     USPC ......................................................... 324/522
     See application file for complete search history.

(56) References Cited

U.S. PATENT DOCUMENTS

| | | | | |
|---|---|---|---|---|
| 4,371,907 A | * | 2/1983 | Bignell | .................. H02H 7/265 361/84 |
| 4,851,782 A | * | 7/1989 | Jeerings | ................ G01R 31/086 324/520 |
| 5,572,138 A | * | 11/1996 | Nimmersjo | ............ H02H 7/265 361/115 |
| 2006/0142964 A1 | | 6/2006 | Saha et al. | |
| 2016/0077150 A1 | * | 3/2016 | Schweitzer, III | .... G01R 31/085 307/125 |
| 2018/0301895 A1 | | 10/2018 | Sri Gopala Krishna Murthi et al. | |

(Continued)

FOREIGN PATENT DOCUMENTS

| JP | S60-204219 A | 10/1985 |
|---|---|---|
| JP | 2018-535633 A | 11/2018 |

OTHER PUBLICATIONS

Extended European Search Report for the corresponding EP application No. EP 20193874.3, dated Mar. 10, 2021, 5 pages.

*Primary Examiner* — Jared Fureman
*Assistant Examiner* — Lucy M Thomas
(74) *Attorney, Agent, or Firm* — Procopio Cory Hargreaves and Savitch LLP

(57) ABSTRACT

A method of determining a fault in a protected zone of a power line comprises obtaining measurements at a measurement point at one end of the power line, processing the measurements in a number of parallel processing branches comprising at least two parallel processing branches, wherein the processing in each branch comprises filtering the measurements in a corresponding low pass filter for obtaining a corresponding set of filtered measurements, wherein the cut-off frequencies of the low pass filters in these parallel processing branches differ from each other, performing reach calculations on the filtered measurements for obtaining corresponding reach point quantities, and comparing the reach point quantities with corresponding thresholds. Finally, it is determined that there is a fault within the protected zone if any threshold is crossed.

20 Claims, 5 Drawing Sheets

(56) References Cited

U.S. PATENT DOCUMENTS

| | | |
|---|---|---|
| 2019/0004103 A1 | 1/2019 | Liu et al. |
| 2019/0072603 A1* | 3/2019 | Liu .................. H02H 3/165 |
| 2019/0293705 A1 | 9/2019 | Liu |

* cited by examiner

Determine three phase fault if $R_A$, $R_B$, $R_C$, are all below a first phase loop threshold TPL1, $R_{AB}$, $R_{BC}$ and $R_{CA}$ are all below a first phase-to-phase loop threshold TPPL1, all incremental phase-to ground loop quantities and all phase-to-phase loop quantities cross their excess quantity thresholds EQT and the incremental zero sequence quantity QZ is below the corresponding zero sequence quantity threshold QZT — 76

Determine single-phase fault if one of $R_A$, $R_B$, $R_C$ is higher than the others, the phase-to-phase loop quantity ratios involving the corresponding phase are higher than the remaining phase-to-phase loop quantity ratio, one incremental phase-to-ground loop quantity and its related incremental phase-to-phase loop quantities cross their excess quantity thresholds EQT and the incremental sequence quantity QZ is above the corresponding zero sequence quantity threshold QZT — 78

Determine two-phase-to-ground fault if one of $R_A$, $R_B$, $R_C$ is smaller than the others, $R_{AB}$, $R_{BC}$ and $R_{CA}$ are below a second phase-to-phase loop threshold TPPL2, all incremental phase-to-phase loop quantities and two incremental phase-to-ground loop quantities cross their excess quantity thresholds EQT and the zero sequence quantity QZ is above the corresponding zero sequence quantity threshold QZT — 80

Determine two-phase fault if two of RA, RB, RC are higher than the remaining phase quantity ratio, RAB, RBC and RCA are below second phase-phase loop threshold TPPL1, all incremental phase-to-phase loop quantities and two incremental phase-to-ground loop quantities cross their excess quantity thresholds EQT and the zero sequence quantity QZ is below the corresponding zero sequence quantity threshold QZT — 82

Fig. 8

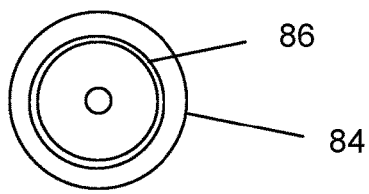

Fig. 9

DETERMINING OF A POWER LINE FAULT

FIELD OF INVENTION

The present invention generally relates to the determination of power line faults. The invention more particularly relates to a method, device and computer program product for determining a power line fault.

BACKGROUND

The determination of faults in power lines is an important aspect in power transmission and distribution systems. Several different ways exist to do this, such as using phasor domain-based distance protection.

One type of scheme that is of interest to use is the time domain distance protection scheme-, which is described in WO 2017/177424. This scheme has the advantage of being fast compared to the protection scheme based on phasor domain. However, there is still room for improvement.

Aspects of the present invention are directed towards improving the time domain distance protection scheme.

SUMMARY OF THE INVENTION

One object of the present invention is to improve the time domain distance protection scheme.

This object is according to a first aspect achieved through a method of determining a fault in a protected zone of a power line. The method comprises:
obtaining voltage and current measurements at a measurement point at one end of the power line,
processing the measurements in a number of parallel processing branches comprising at least two parallel processing branches, wherein the processing in each branch comprises
filtering the measurements in a corresponding low pass filter for obtaining a corresponding set of filtered measurements, wherein the cut-off frequencies of the low pass filters in these parallel processing branches differ from each other,
performing reach calculations on the filtered measurements for obtaining corresponding reach point quantities, and
comparing the reach point quantities with corresponding thresholds, and
determining that there is a fault within the protected zone of the power line if any of the thresholds is crossed in any of the parallel processing branches.

The object is according to a second aspect achieved through a device for determining a fault in a protected zone of a power line, where the device is configured to:
obtain voltage and current measurements at a measurement point at one end of the power line,
process the measurements in a number of parallel processing branches comprising at least two parallel processing branches, wherein the processing in each branch comprises
filtering the measurements in a corresponding low pass filter for obtaining a corresponding set of filtered measurements, wherein the cut-off frequencies of the low pass filters in these parallel processing branches differ from each other,
performing reach calculations on the filtered measurements for obtaining corresponding reach point quantities, and
determine that there is a fault within the protected zone of the power line if one of the thresholds is crossed in any of the parallel processing branches.

The object is according to a third aspect achieved through a computer program product for determining a fault in a protected zone of a power line, where the computer program product is provided on a data carrier comprising computer program code configured to cause a processor to, when the computer program code is being operated upon by the processor
obtain voltage and current measurements at a measurement point at one end of the power line,
process the measurements in a number of parallel processing branches comprising at least two parallel processing branches, wherein the processing in each branch comprises
filtering the measurements in a corresponding low pass filter for obtaining a corresponding set of filtered measurements, wherein the cut-off frequencies of the low pass filters in these parallel processing branches differ from each other,
perform reach calculations on the filtered measurements for obtaining corresponding reach point quantities, and
determine that there is a fault within the protected zone of the power line if any of the thresholds is crossed in any of the parallel processing branches.

The determining of a fault in a protected zone of a power line may be made using a time domain distance protection scheme. This scheme A may be designed to detect all faults within a protected zone on a given power line. A protected Zone may be termed Zone 1, which is the length between the measurement location at one end of the power line and a reach point, which is known as Zone 1 boundary. The reach point is normally set to 80% of the power line length. All faults within Zone 1 are defined as internal faults so that a Zone 1 protection function should detect and trip these faults. All faults outside of Zone 1 are considered to be external faults so that Zone 1 protection scheme should not trip.

The reach point quantities determined in the different branches may be the same. However, the values of theses reach point quantities may differ between the branches. The reach point quantities that correspond to a set of filtered measurements may thereby differ from reach point quantities that correspond to another set of filtered measurements through the reach point quantity values of the branches differing from each other.

The cut-off frequencies used in each parallel branch is different with each other from low to the high frequency values. A threshold for a reach calculation loop with a lower cut-off frequency filter may furthermore be lower than a corresponding threshold for a reach calculation loop with a higher cut-off frequency filter.

In the context of present invention, processing in a number of parallel processing branches may mean that the processing in each branch, e.g. the filtering of the respective measurements, starts simultaneously in respect to each other or within a delay of maximum 100 µs in relation to each other. Processing in the parallel branches may thereby be started within a time span of 0-100 µs in relation with each other. After start of the processing, i.e. after the filtering, the processing in each branch may continue in an unsynchronized or in a synchronized way with each other until a fault determination is made. It is additionally possible that the decision that there is a fault is made for a comparison in which the corresponding threshold is first crossed.

The reach calculations may be calculations in the time domain of quantities at a reach point of the power line. The quantities may be reach point quantities. The reach point quantities may additionally be the quantities in waveshapes such as sinus waveshapes recurring with a periodicity. They may thus have a period, which corresponds to a fundamental frequency of the waveshape. The reach point quantities may in particular be incremental reach point quantities in the time domain. A quantity may be a difference between a present reach point quantity value and a corresponding reach point quantity value in a previous period. The reach point quantities may be voltages.

A reach point quantity may be calculated as a phase-to-ground loop quantity or a phase-to-phase loop quantity, where a phase-to ground loop quantity is a quantity, such as a voltage, of a phase-to-ground loop and a phase-to-phase loop quantity is a quantity, such as a voltage, of a phase-to-phase loop. Each processing branch may additionally perform reach calculations for all phase-to-ground loops and all phase-to-phase loops of the power line.

The measurement point at one end of the power line determining of the power line faults is a local point of a protection relay provided for this end of the power line. All parallel branches with different cut-off frequencies are associated with the intended reach length of the whole power line.

It is also possible that the absolute value of each reach point quantity in each parallel processing branch with the corresponding cut-off frequency is compared with a corresponding threshold to detect the internal fault.

The thresholds used in the branches may be the same or differ from each other If, according to one advantageous variation, the first set of filtered measurements have been filtered with a higher cut-off frequency than the second set of filtered measurements, then thresholds used in the first branch may be higher than the corresponding thresholds used in the second branch.

A reach point quantity and its corresponding threshold may be provided for a certain phase-to-ground loop or a certain phase-to-phase loop of the power line. The reach calculations therefore comprise phase-to-ground loop calculations and phase-to-phase loop calculations.

There may be a set of thresholds in each branch, where each set may comprise a group of primary thresholds for a first type of fault and/or a group of secondary thresholds for a second type of fault. The first type of fault may be a phase-to-ground fault and the second type of fault may be a phase-to-phase fault.

The reach calculations in each branch may thereby comprise phase-to-ground loop calculations and phase-to-phase loop calculations. In particular, the comparing of the reach point quantities with corresponding thresholds may comprise comparing the phase-to-ground loop calculations with corresponding primary thresholds and comparing the phase-to-phase loop calculations with corresponding secondary thresholds. The thresholds in the group of primary thresholds may additionally have different values than the thresholds in the group of secondary thresholds.

The method may furthermore comprise a phase selection scheme in which fault types are detected.

The phase selection scheme may comprise calculating ratios of phase-to-ground loop quantities and phase-to-phase loop quantities, i.e. determining of phase-to-ground loop quantity ratios and phase-to-phase loop quantity ratios, comparing the ratios with corresponding thresholds and determining a type of fault based on the comparisons of the ratios.

The calculating of the ratios may comprise dividing a phase-to-ground loop quantity by the lowest of the phase-to-ground loop quantities and dividing a phase-to-phase loop quantity by the lowest of the phase-to-phase loop quantities.

The ratios may be the ratios of incremental phase-to-ground loop quantities and incremental phase-to-phase loop quantities. They may therefore also be considered to be incremental quantity ratios.

The incremental quantity may be a difference between a present quantity value and a corresponding quantity value in a previous period. The incremental quantity calculation may additionally be based on currents. However, the incremental quantity calculation may also be based on voltages.

The method may additionally comprise comparing each of a number of phase-to-ground loop quantities and each of a number of phase-to-phase loop quantities with corresponding excess quantity thresholds. The calculating of the ratios may with advantage be preceded by the comparing of phase-to-ground loop quantities and phase-to-phase loop quantities with corresponding excess quantity thresholds.

The performing of the phase selection scheme may additionally be made if any of the excess quantity thresholds are crossed. The calculating of the ratios may thereby be preceded by a startup function, where the startup function comprises comparing each of a number of phase-to-ground loop quantities and each of a number of phase-to-phase loop quantities with corresponding excess quantity thresholds. Thereby the startup function may determine that at least one of the excess quantity thresholds is crossed and thereafter initiate the phase section scheme.

The phase selection scheme may thus be preceded by a start-up function, where a certain outcome of processing in the start-up function may trigger the carrying out of the phase selection scheme. Only if the start-up function operates to indicate that there is a fault or disturbance on the power line, the device or method may go further to perform the phase selection scheme for detecting the fault types.

The method may further comprise determining if there is a zero-sequence or zero-mode quantity and the device may be further configured to determine if there is a zero-sequence current for detecting the fault types with grounded loops. The determining of if there is a zero-sequence or zero mode quantity may involve comparing the zero-sequence or zero mode quantity with a zero-sequence quantity threshold.

A three-phase fault may be determined if the phase-to-ground loop quantity ratios are all below a first phase-to-ground loop threshold and the phase-to-phase loop quantity ratios are all below a first phase-to-phase loop threshold and if all the calculated quantities in all loops have crossed their corresponding excess quantity thresholds and the zero-sequence quantity is below the zero sequence quantity threshold.

A single-phase-to-ground fault may be determined if the phase-to-ground loop quantity ratio involving a certain phase is higher than the other phase-to-ground loop quantity ratios and the phase-to-phase loop quantity ratios involving the same certain phase are also higher than the remaining phase-to-phase loop quantity ratio and if the calculated phase-to-ground loop quantity of said certain phase and the calculated phase-to-phase loop quantities involving the same certain phase have crossed their corresponding excess quantity thresholds and the zero-sequence quantity is above the zero sequence quantity threshold.

A two-phase-to-ground fault may be determined if one of the phase-to-ground loop quantity ratios is smaller than the other two phase-to-ground loop quantity ratios and all the phase-to-phase loop quantity ratios are smaller than a corresponding second phase-to-phase loop threshold and if all calculated phase-to-phase loop quantities and the calculated phase-to-ground loop quantities that are related to the other two phase-to-ground loop quantity ratios have crossed their corresponding excess quantity thresholds and the zero-sequence quantity is above the zero sequence quantity threshold.

A two-phase fault may be determined if two of the phase-to-ground loop quantity ratios are higher than the remaining phase-to-ground loop quantity ratio and all the phase-to-phase loop quantity ratios are smaller than a corresponding second phase-to-phase loop threshold and if all calculated phase-to-phase loop quantities and the calculated phase-to-ground loop quantities that are related to the two phase-to-ground loop quantity ratios have crossed their corresponding excess quantity thresholds and the zero-sequence quantity is below the zero sequence quantity threshold The present invention has a number of advantages. It allows a fault of a power line to be determined both fast and reliably.

BRIEF DESCRIPTION OF THE DRAWINGS

The present invention will in the following be described with reference being made to the accompanying drawings, where FIG. 1 schematically shows a power line connected to a protection relay via a current transformer and a voltage transformer, FIG. 2 schematically shows a protection relay comprising a reach calculation module, a phase selection module and a tripping module, FIG. 3 schematically shows an alternative realization of the protection relay for implementing the reach calculation module, the phase selection module and the tripping module.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

The present invention generally concerns the handling of faults in a power line.

Figure 1:
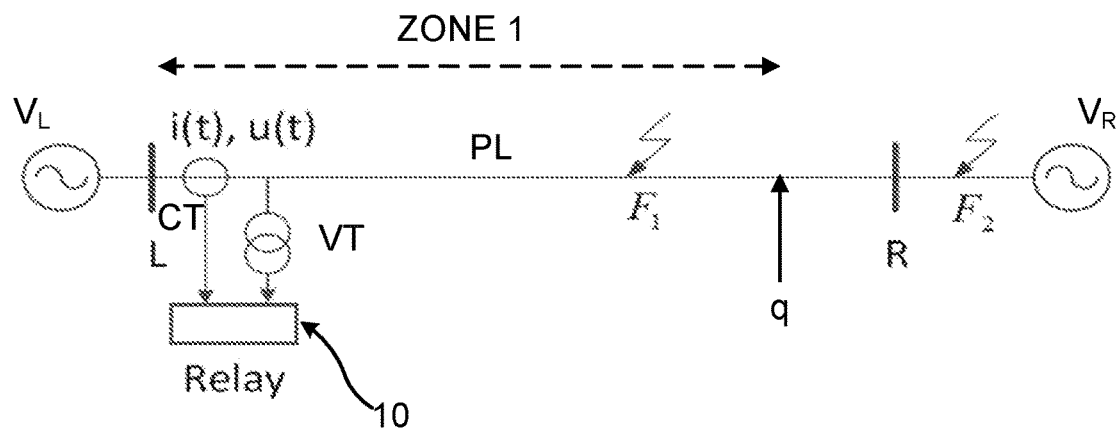

FIG. 1 schematically shows a power line PL connected between two voltage sources, a first local voltage source $V_L$ at a local point L and a second voltage source $V_R$ at a remote point R. At the local point L there is also a device for determining a power line fault. The device is in this example implemented as a protection relay 10 connected to the power line PL via a current transformer CT and a voltage transformer VT at a measurement point at one end of the power line, which measurement point is the above-mentioned local point L. The protection relay 10 measures the current i(t) and voltage v(t) of the power line PL at discrete points in time or time instances, often denoted sampling times. In the figure there is also shown a first fault F1 on the power line between the local point L and the remote point R and a second Fault F2 between the remote point R and the second voltage source $V_R$. There is also a reach point q between the first fault F1 and the remote point R. The reach point q is typically the furthest point on the power line PL from the protection relay 10 at which this protection relay 10 is to handle faults. In practice, it is known as Zone 1 protection range, which is normally around 80% of line length of a given power line. The reach point thereby defines the above-mentioned protected zone boundary. As the first fault F1 occurs in the power line connected between the bus R and bus L, which is known as an internal fault, it is thus typically to be handled by the protection relay 10, while the second fault F2, which is outside of the power line (PL) between R and L and F2 is known as an external fault, should be handled by other devices.

Figure 2:
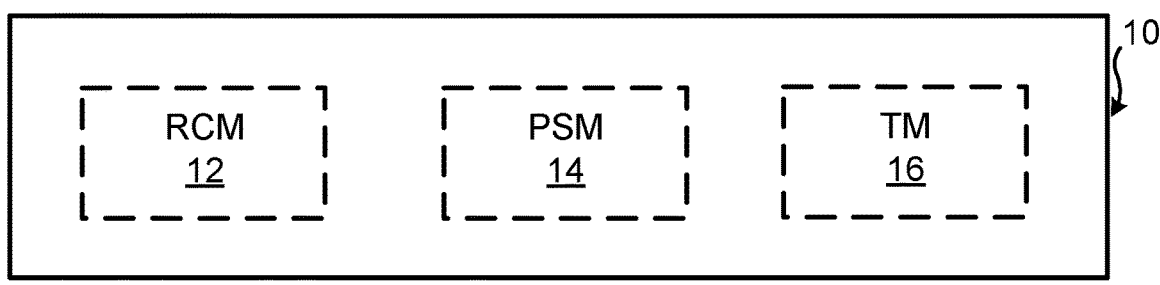

FIG. 2 schematically shows one realization of some aspects of the protection relay 10. The protection relay 10 comprises a reach calculation module RCM 12 for implementing a power line fault determination based on reach calculations, a phase selection module PSM 14 for implementing a phase selection scheme and a tripping module TM 16 for tripping of the power line PL. The tripping module 16 may be connected to a circuit breaker for tripping the power line PL. It is in some instances also possible that the protection relay 10 comprises such a circuit breaker.

Figure 3:
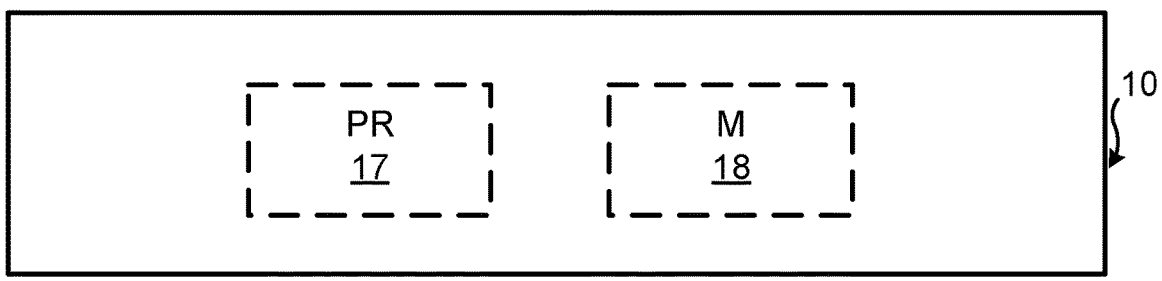

The functionality of the reach calculation module 12, phase selection module 14 and tripping module 16 may be implemented in at least one integrated circuit such as an Application-Specific Integrated Circuit (ASIC) or Field-Programmable Gate Arrays (FPGA). As an alternative the modules may be realized as one or more processors acting on computer program instructions in one or more computer memories implementing the module functionality. FIG. 3 shows one alternative realization of the modules in the protection relay 10 where there is a processor PR 17 and a memory 18 and the processor 17 acts on computer instructions in the memory 18 implementing the modules.

Figure 4:
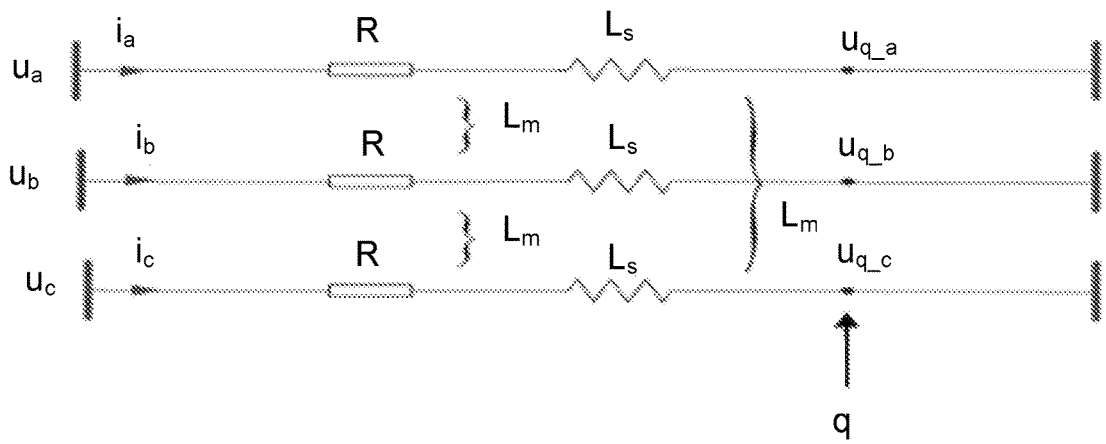
FIG. 4 shows a three-phase transmission line diagram of the power line with an indication of a reach point, FIG. 5 schematically shows a flow chart of a number of elements in a first variation of a method of determining a power line fault being performed by the reach calculation module, FIG. 6 schematically shows a flow chart of a number of elements in a second variation of the method of determining a power line fault being performed by the reach calculation module, FIG. 7 schematically shows a flow chart of a number of elements being performed by the phase selection module in a phase selection scheme for indicating one or more faulty phases, FIG. 8 schematically shows how determining types of faults are determined in the phase section scheme, and FIG. 9 schematically shows a data carrier with computer program code, in the form of a CD-ROM disc, for implementing the reach calculation module and phase selection module.

The reach calculation module determines internal power line faults based on reach calculations, which calculations will now be described with reference to FIG. 4, which shows a three-phase transmission line diagram of the power line with an indication of the reach point q.

The power line may have three phases, a, b and c and each phase may be modeled by a voltage, a current, a phase resistance and a phase inductance. The model may additionally comprise phase-to-phase inductances between the phases. In relation to the reach point q, the first phase a may be modeled through a phase voltage $u_a$ applied on the phase driving a phase current $i_a$ towards the reach point q through a resistance R and a phase inductance $L_s$. In a similar manner, the second phase b may be modeled through a phase voltage $u_b$ applied on the phase driving a phase current $i_b$ towards the reach point q through a resistance R and a phase inductance $L_s$. Also, the third phase c may be modeled through a phase voltage $u_c$ applied on the phase driving a phase current $i_c$ towards the reach point q through a resistance R and a phase inductance $L_s$. Furthermore, there is a phase-to-phase inductance $L_m$ between the first and second phase a and b, a phase-to-phase inductance $L_m$ between the second and third phase b and c and a phase-to-phase inductance $L_m$ between the third and first phase c and a. In the figure also reach point voltages $u_{q\_a}$ of the first phase a, $u_{q\text{-}b}$ of the second phase b and $u_{q\_c}$ of the third phase c at the reach point q are show.

The protection scheme used is a time domain protection scheme and in this scheme the reach point voltages are calculated based on differential equations. Six electrical power line quantities at the reach point in and between the phases are calculated. As an example, six voltages in and between the phases are calculated, here also denoted loop voltages. The reach point or loop voltages $u_{q\_a}(t)$, $u_{q\_b}(t)$, $u_{q\_c}(t)$, $u_{q\_ab}(t)$, $u_{q\_ac}(t)$, $u_{q\_ca}(t)$ are thus calculated. The following equations describe one way in which these six-loop voltages can be calculated directly in the time domain based on general differential equations:

$$u_{q\_a}(t) = u_a(t) - \left[ R \cdot i_a(t) + L_s \cdot \frac{di_a(t)}{dt} + L_m \cdot \frac{di_b(t)}{dt} + L_m \cdot \frac{di_c(t)}{dt} \right] \quad (1)$$

$$u_{q\_b}(t) = u_b(t) - \left[ R \cdot i_b(t) + L_s \cdot \frac{di_b(t)}{dt} + L_m \cdot \frac{di_a(t)}{dt} + L_m \cdot \frac{di_c(t)}{dt} \right] \quad (2)$$

$$u_{q\_c}(t) = u_c(t) - \left[ R \cdot i_c(t) + L_s \cdot \frac{di_c(t)}{dt} + L_m \cdot \frac{di_a(t)}{dt} + L_m \cdot \frac{di_b(t)}{dt} \right] \quad (3)$$

$$u_{q\_ab}(t) = u_{q\_a}(t) - u_{q\_b}(t) \quad (4)$$

$$u_{q\_bc}(t) = u_{q\_b}(t) - u_{q\_c}(t) \quad (5)$$

$$u_{q\_ca}(t) = u_{q\_c}(t) - u_{q\_a}(t) \quad (6)$$

In time domain protection the incremental voltages at the reach point q may further be calculated based on the following equations:

$$\Delta u q\_a(t) = u q\_a(t) - u q\_a(t-T) \quad (7)$$

$$\Delta u q\_b(t) = u q\_b(t) - u q\_b(t-T) \quad (8)$$

$$\Delta u q\_c(t) = u q\_c(t) - u q\_c(t-T) \quad (9)$$

The same calculation method in equation (7), (8), (9) could be applied to phase-to-phase loops to get $\Delta u_{q\_ab}(t)$, $\Delta u_{q\_bc}(t)$, $\Delta u_{q\_ca}(t)$. Here T is the time for one fundamental frequency period. For 50 Hz power system, T is 20 milliseconds.

A protection trip criterion could be expressed as below in equation (10) for a phase-to-ground loop and equation (ii) for a phase-to-phase loop in general forms:

$$|\Delta u_{q\_\phi}(t)| > K_{rel1} * |U_{set1}| \quad (10)$$

$$|\Delta u_{q\_\phi\phi}(t)| > K_{rel2} * |U_{set2}| \quad (11)$$

Here, $\Delta u_{q\_\phi}(t)$ represents one of the incremental phase voltages at the reach point q and $\Delta u_{q\_\phi\phi}(t)$ represents one of the incremental phase-to-phase voltages at the reach point q. $K_{rel1}$ and $K_{rel2}$ are reliability factors which may be equal to or larger than 1.0, while Uset1 and Uset2 are two setting threshold values for phase-to-ground loops and phase-to-phase loops.

As described before, one central part of the time domain protection may be the reach calculation which is based on the calculation of electrical quantities of the power line, which quantities in the examples given above are voltages. However, it should be realized that it is possible to use currents instead. The voltages at the reach point q are determined as described in equation (1) to (6). The voltages are waveshapes such as sinus waveshapes recurring with a periodicity. They thus have a period T, which corresponds to a fundamental frequency, here the fundamental frequency may be 50 or 60 Hz depending on the type of application or power systems.

As can be seen in equations (7), (8) and (9) above, the incremental reach point quantities, which in this case are the reach point voltages in and between the phases, are determined as the difference between a present reach point quantity value and a corresponding reach point quantity value in a previous period.

The calculation error of the differential algorithm may be influenced by high frequency transients. Therefore, a low pass filter may be needed for every parallel before the reach calculations are carried out in order to filter out noise signals in the high frequency spectrum.

The reach calculation loop with higher cut-off frequency filter normally has higher tripping speed compared with the reach calculation loop with lower cut-off frequency filter. On the other hand, the reach calculation loop with higher cut-off frequency filter may have respectively larger calculation error compared with the reach calculation loop with lower cut-off frequency filter. To ensure the whole reach calculation function take advantages from the reach calculation loops with both high cut-off frequency loops and low cut-off frequency loops with good security, speed and coverage at the same time, a combination of reach calculations may be used. One basic idea described herein is to use a group of reach calculation processing branches for the same reach calculation loop in parallel, wherein the cut-off frequencies of the group of low-pass filters are different from each other. So that the best performance of time domain protection could be obtained. There may thus be provided a reach calculation function including multi reach calculation loops working in parallel based on corresponding low pass filters with different cut-off frequencies. Here, normally, the reach calculation loop with lower cut-off frequency filter may use lower threshold. And the reach calculation loop with higher cut-off frequency filter may use higher threshold. For normal transmission line systems, two or three cut-off frequencies may be used in the reach calculation function. And the reach calculation branches with different cut-off frequencies may be used to cover different sections of the power line or the same section of the power line. Considering that the reach calculation based on lower cut-off frequency filter has better calculation accuracy than that based on higher cut-off frequency filter, it may set the reach calculation based on lower cut-off frequency filter to have longer coverage than that based on higher cut-off frequency filter, so that the whole reach calculation function can get both fast operation for close-in faults and secure operation for remote faults at the same time.

In its simplest form there may be only two low pass filters, a first lowpass filter LPF1 having a first cut-off frequency f1 and a second low pass filter with a second cut-off frequency f2, where the first low pass filter LPF1 is associated with a first section of the power line, such as a section forming 0-40% of the power line, and the second low pass filter LPF2 is associated with a second section of the power line, such as a section forming 0-80% of the power line. Thereby the first section is closer to the protection relay location at the local point L than the second section. Moreover, the cut-off frequency f1 of the first low pass filter is higher than the cut-off frequency f2 of the second lowpass filter.

However, as was mentioned earlier there may be more filters. There may typically be N filters, where N is an integer that is higher than or equal to two. As an example, N may be three or four.

One way in which N low pass filters can be employed in a method of determining a power line fault will now be described with reference also being made to FIG. 5, which schematically shows a number of elements in a first variation in the determining of a power line fault being performed by the reach calculation module 12 in the protection relay 10.

The reach calculation module 12 first obtains voltage and current measurements u(t) and i(t) of the power line PL at a measurement point at one end of the power line, element 20, which may be done based on the current transformer CT measuring the currents in the power line PL and the voltage transformer VT measuring the voltages in the power line at the measurement point L. Moreover, the electrical power line quantities, here currents i(t) and voltages v(t), obtained by the reach calculation module 12 in this case comprise the electrical quantities of a present time instance t as well as earlier electrical quantities of a corresponding time instance (t−T) in a previous period T. The present and earlier quantity measurements may thereby be obtained for the same phase angle in consecutive periods.

Figure 5:
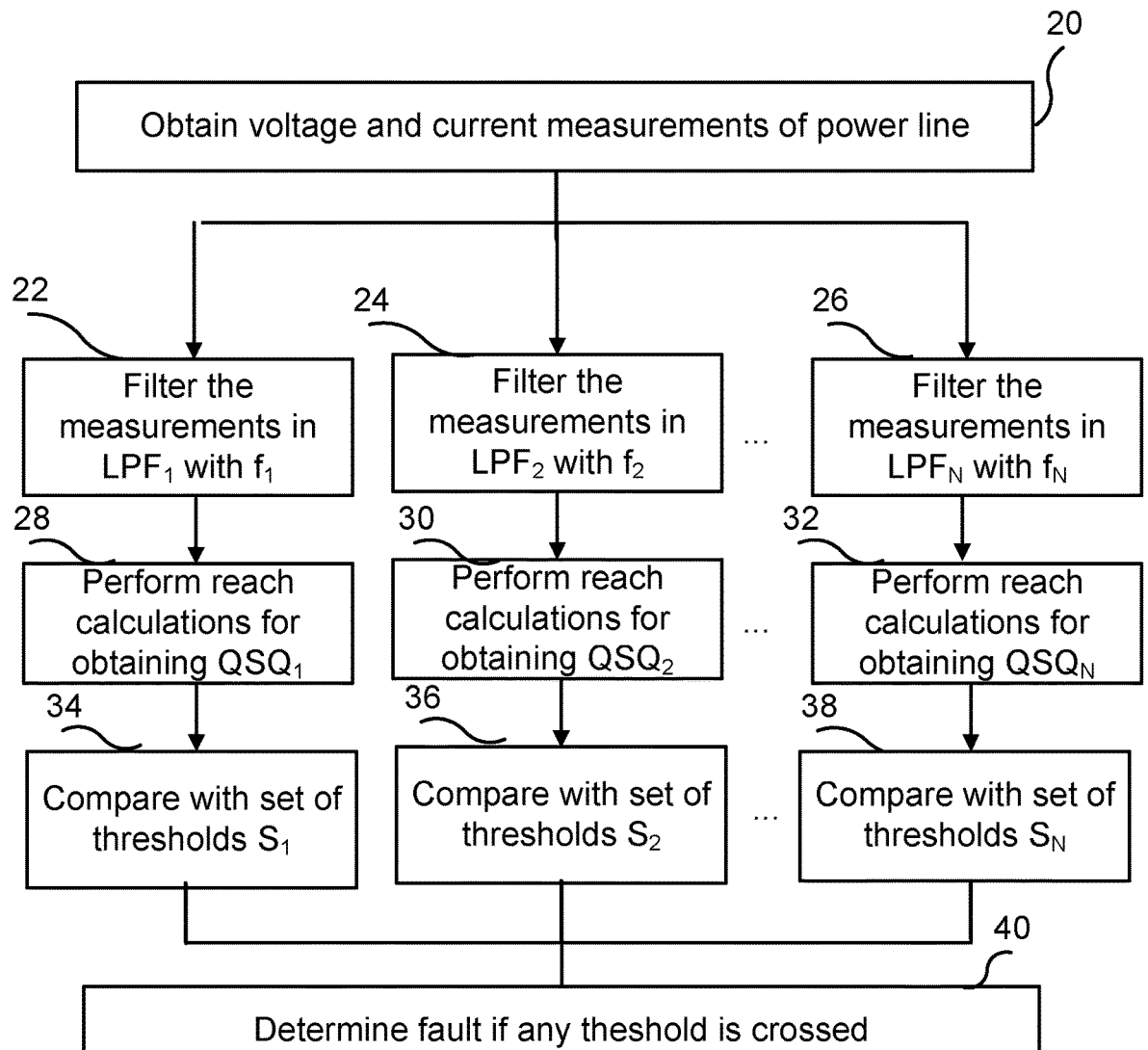

The reach calculation module 12 then processes the obtained quantities in a number of parallel processing branches comprising at least two processing branches, where FIG. 5 shows a first, second and Nth parallel branch.

The processing in the N parallel processing branches may mean that the processing in each branch, e.g. the filtering of the respective measurements, starts simultaneously in respect to each other or within a delay of maximum 100 µs in relation to each other. Processing in the parallel branches may thereby be started within a time span of 0-100 µs in relation with each other, where zero may be preferred. This means that the processing of a "late" branch has to be started within 100 µs after the first started processing of a first branch. After start of the processing, the processing in each branch may continue in a unsynchronized or an in synchronized way with each other up until a fault determination is made. The processing in each branch comprises filtering the measurements in a low pass filter for obtaining a corresponding set of filtered measurements, wherein the cut-off frequencies of the low pass filters differ from each other, performing reach calculations on the filtered measurements for obtaining corresponding reach point quantities and comparing the reach point quantities with corresponding thresholds.

In a first branch, the reach calculation module 12 filters the measurements in the first lowpass filter $LPF_1$ with a first cut-off frequency $f_1$, element 22. Thereby it obtains a first set of filtered measurements. The reach calculation module 12 then performs reach calculations on the first set of filtered measurements for obtaining a first set of reach point quantities $QSQ_1$, element 28. The reach calculation module 12 thereafter compares the first set of reach point quantities $QSQ_1$ with a corresponding first set of thresholds $S_1$, element 34. It thus compares each reach point quantity in the first set of reach point quantities with a threshold in the first set of thresholds S1. The performing of these comparisons complete the first branch.

In a second branch, the reach calculation module 12 filters the measurements in the second low pass filter $LPF_2$ with a second cut-off frequency $f_2$, element 24, and thereby it obtains a second set of filtered measurements. Each set of filtered measurements then comprises the currents and voltages of the three phases for the present and earlier sampling time instances t and (t−T).

It also performs reach calculations on the second set of filtered measurements for obtaining a second set of reach point quantities $QSQ_2$, element 30. The reach calculation module 12 compares the second set of reach point quantities $QSQ_2$ with corresponding secondary thresholds, element 32. It thus compares each reach point quantity in the second set with a corresponding threshold in a second set of thresholds $S_2$. The performing of these comparisons completes the second branch.

In an Nth branch, the reach point calculation module 12 filters the measurements in an Nth lowpass filter $LPF_N$ with an Nth cut-off frequency $f_N$, element 26. Thereby it obtains an Nth set of filtered measurements. The reach point calculation module 12 then performs reach point calculations on the Nth set of filtered measurements for obtaining an Nth set of reach point quantities $QSQ_N$, element 32. The reach point calculation module 12 thereafter compares the Nth set of reach point quantities $QSQ_N$ with a corresponding Nth set of thresholds SN, element 38. It thus compares each reach point quantity in the Nth set of reach point quantities with a corresponding threshold in the Nth set of thresholds $S_N$. The performing of these comparisons completes the Nth branch.

Each processing branch may in this case perform reach point calculations for all phase-to-ground loops and all phase-to-phase loops of the power line.

The reach point quantities determined in the different branches will then be the same. However, the values of these reach point quantities may differ between the branches. The reach point quantities that correspond to a set of filtered measurements may thereby differ from reach point quantities that correspond to another set of filtered measurements through the reach point quantity values of the branches differing from each other.

The cut-off frequencies are typically different from each other. The second cut-off frequency fa is typically different from the first cut-off frequency $f_1$ and the Nth frequency is typically different from both the first and the second frequency. The thresholds used in the branches may be the same or differ from each other. In one advantageous embodiment the first set of filtered measurements have been filtered with a higher cut-off frequency than the second set of filtered measurements. In this case each threshold in the first set is higher than the corresponding threshold in the second set. If the second set of filtered measurements have been filtered with a higher cut-off frequency than the Nth set of filtered measurements, then each threshold in the second set is also higher than its corresponding threshold in the Nth set.

The reach calculation module 12 then determines that there is a fault in the protected zone if any of the thresholds is crossed, element 40. This may involve determining that there is a fault in the protected zone if any of the reach point quantities in the first set $QSQ_1$ cross any of the thresholds in the first set of thresholds S1, if any of the reach point quantities in the second set $QSQ_2$ cross any of the secondary thresholds in the second set of thresholds $S_2$ or if any of the reach point quantities in the Nth set $QSQ_N$ cross any of the thresholds in the Nth set of thresholds $S_N$.

The filtering in the first low pass filter $LPF_1$, the performing of reach calculations on the first set of filtered measurements and the comparing of the first set of reach point quantities $QSQ_1$ with a first set of thresholds is thus performed in a first processing branch, the filtering in the second low pass filter $LPF_2$, the performing of reach calculations on the second set of filtered measurements and the comparing of the second set of reach point quantities $QSQ_2$ with a second set of thresholds S2 is performed in the second processing branch and the filtering in the Nth low pass filter $LPF_N$, the performing of reach calculations on the Nth set of filtered measurements and the comparing of the Nth set of reach point quantities $QSQ_2$ with an Nth set of thresholds $S_N$ is performed in the Nth processing branch, where the processing in the branches is started simultaneously and then continue independently from each other up until a fault determination is made.

The determining that there is a fault in the protected zone may involve determining that there is a fault as soon as any of the thresholds is crossed. The determining that there is a fault may thus be made for a comparison in which the corresponding threshold is first crossed. It is also possible that the absolute value of each reach point quantity is compared with the thresholds. The reach calculation module may then inform the tripping module 16 of the fault, which module may then continue and trip one or more of the phases of the power line based on the fault determination.

A reach point quantity and its corresponding threshold may be provided for a certain phase of the power line. The reach point calculations may thus comprise phase-to-ground loop calculations that are compared with corresponding primary thresholds. It is for instance possible that each threshold in a set of thresholds is provided for a corresponding reach point quantity of a certain phase of the power line, such as phase A, phase B or phase C. The reach calculations being performed for each set of filtered measurements may then be the determining of the reach point voltages according to equations (1)-(3) for the present and earlier sampling instances t and (t−T) and the determining of the incremental phase voltages for each phase according to equations (7)-(9). In this case there may only be a group of primary thresholds in each set of thresholds. The comparison may in this case involve comparing the incremental phase voltages of the first set of reach point quantities $QSQ_1$ with the group of primary thresholds in the first set of thresholds S1, comparing the incremental phase voltages of the second set of reach point quantities $QSQ_2$ with the group of primary thresholds in the second set of thresholds $S_2$ and comparing the incremental phase voltages of the Nth set of reach point quantities $QSQ_N$ with the group of primary thresholds in the Nth set of thresholds $S_N$, where each primary threshold in the first set of thresholds $S_1$ may be higher than the corresponding primary threshold in the second set of thresholds $S_2$ and each primary threshold in the second set of thresholds $S_2$ may be higher than the corresponding primary threshold in the Nth set of thresholds $S_N$. A phase-to-ground fault may then be determined for a certain phase if the incremental phase voltage in any of the first, second and Nth set of reach point quantities $QSQ_1$ and $QSQ_2$ cross a corresponding primary threshold. In this example a certain type of fault involving a specific phase may be determined if any of the thresholds is crossed for that phase.

A reach point quantity and its corresponding threshold may as an alternative be provided for a certain combination of phases of the power line. The reach point calculations may thus comprise phase-to-phase loop calculations that are compared with corresponding secondary thresholds. It is for instance possible that each threshold in a set of thresholds is provided for a corresponding reach point quantity of a combination of certain phases, such as a combination of two phases of the power line, like phase A and phase B, phase B and phase C or phase C and phase A. In this case, the reach calculations may involve determining the reach point voltage according to equations (4)-(6) for the present and earlier sampling instances t and (t−T) and determining the incremental phase-to-phase voltages employing the principles outlined in equations (7)-(9). In this case there may only be a group of secondary thresholds in each set of thresholds. The comparison may in this case involve comparing the incremental phase-to-phase voltages in the first set of reach point quantities $QSQ_1$ with the group of secondary thresholds in the first set of thresholds $S_1$, comparing the incremental phase-to-phase voltages of the second set reach point quantities $QSQ_2$ with the group of secondary thresholds in the second set of thresholds and comparing the incremental phase-to-phase voltages in the Nth set of reach point quantities $QSQ_N$ with the group of secondary thresholds in the Nth set of thresholds $S_N$, where each secondary threshold in the first set of thresholds $S_1$ may be higher than the corresponding secondary threshold in the second set of thresholds $S_2$ and each secondary threshold in the second set of thresholds S2 may be higher than the corresponding secondary threshold in the Nth set of thresholds $S_N$. A phase-to-phase fault may then be determined for two phases if the incremental phase-to-phase voltage in any of the first, second and Nth sets of reach point quantities cross the corresponding secondary threshold. In this example a certain type of fault involving two phases may be determined if any of the secondary thresholds are crossed for this phase combination.

As can be seen above, it is possible that a set of thresholds is made of up of a primary group of thresholds or a secondary group of thresholds. As an alternative it is possible that each set of threshold comprises both the primary group of thresholds and the secondary group of thresholds.

These may additionally be used simultaneously. In the example with a first, second and Nth parallel branch there may thus simultaneously be a first group of primary threshold and a first group of secondary thresholds, a second group of primary thresholds and a second group of secondary thresholds as well as an Nth group of primary thresholds and an Nth group of secondary thresholds. In case the first cut-off frequency $f_1$ is higher than the second cut-off frequency $f_2$, which in turn is higher than the Nth cut-off frequency $f_N$, each threshold in the first group of primary threshold may in this case be higher than the corresponding threshold in the second group of primary thresholds and each threshold in the second group of primary thresholds may be higher than the corresponding threshold in the Nth group of primary thresholds. In a similar manner, each threshold in the first group of secondary thresholds may be higher than the corresponding threshold in the second group of secondary thresholds and each threshold in the second group of secondary thresholds may be higher than the corresponding threshold in the Nth group of secondary thresholds. The thresholds in the first group of thresholds may have different values than the thresholds in the second group of thresholds. The thresholds in first group of primary thresholds may additionally be higher than the corresponding thresholds in the first group of secondary thresholds, the thresholds in second group of primary thresholds may be higher than the corresponding thresholds in the second group of secondary thresholds and the thresholds in Nth group of primary thresholds may be higher than the corresponding thresholds in the Nth group of secondary thresholds.

Figure 6:
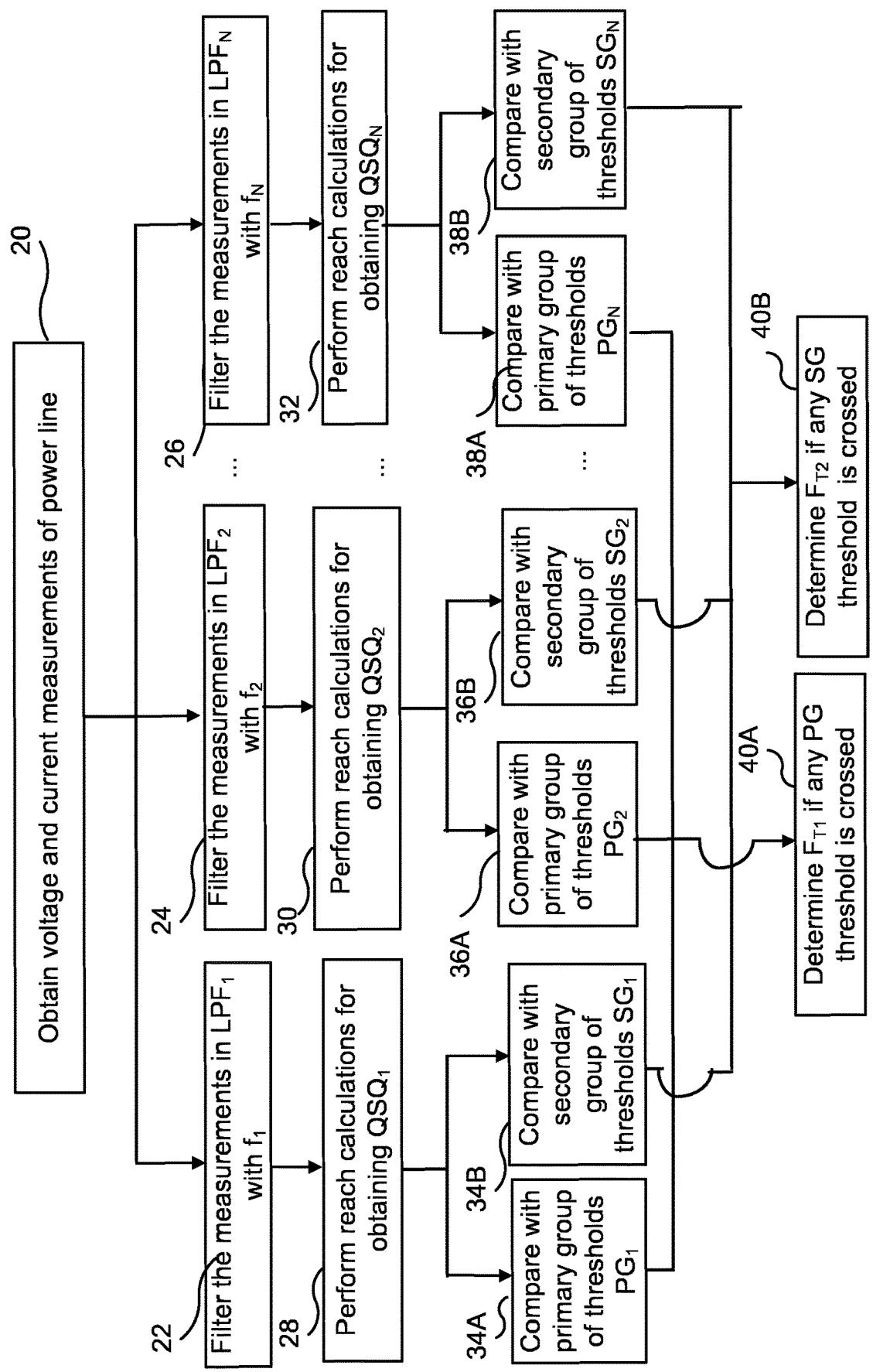

How these thresholds may be handled will now be described with reference being made to FIG. 6, which shows a flow chart of a second variation in the determining power line faults.

The reach calculation module 12 obtains voltage and current measurements v(t) and i(t) of the power line PL in the same way as was described earlier in relation to FIG. 5, element 20. It also processes these electrical power line quantities in N separate branches, where N is at least two.

In the first processing branch, the reach calculation module 12 thus filters the measurements in the first lowpass filter $LPF_1$ with the first cut-off frequency $f_1$, element 22, performs reach calculations on the first set of filtered measurements for obtaining a first set of reach point quantities $QSQ_1$, element 28, and compares the first set of reach point quantities with a first group of primary thresholds $PG_1$, element 34A, and a first group of secondary thresholds $SG_1$, element 34B in the first set of thresholds, which completes the first branch.

In the second processing branch, the reach calculation module 12. simultaneously filters the measurements in the second low pass filter $LPF_2$ with the second cut-off frequency $f_2$, element 24, performs reach calculations on the second set of filtered measurements for obtaining a second set of reach point quantities $QSQ_2$, element 30, and compares the second set of reach point quantities with a second group of primary thresholds $PG_2$, element 36A, and a second group of secondary thresholds $SG_2$, element 36B in the second set of thresholds, which completes the second branch.

In the Nth processing branch, the reach calculation module 12. simultaneously filters the measurements in the Nth low pass filter $LPF_N$ with the Nth cut-off frequency $f_N$, element 26, performs reach calculations on the Nth set of filtered measurements for obtaining an Nth set of reach point quantities $QSQ_N$, element 32, and compares the Nth set of reach point quantities with an Nth group of primary thresholds $PG_N$, element 38A, and an Nth group of secondary thresholds $SG_N$, element 38B in the Nth set of thresholds, which completes the Nth branch.

The reach calculations in each branch thereby comprise phase-to-ground loop calculations and phase-to-phase loop calculations. In particular the comparing of the reach point quantities with corresponding thresholds in this case comprise comparing the phase-to-ground loop calculations with corresponding primary thresholds and comparing the phase-to-phase loop calculations with corresponding secondary thresholds.

The processing in the branches is in this case also started within the above-mentioned time span and continues synchronized or unsynchronised up until the fault determination.

The reach calculations being performed for each set of filter quantities in this case involves determining the reach point voltages according to equations (1)-(6) and determining the incremental phase voltages for each phase according to equations (7)-(9) as well as the incremental phase-to-phase voltages using the principles of equations (7)-(9).

In the first processing branch, the reach calculation module 12 more particularly compares the incremental phase voltages in the first set of reach point quantities $QSQ_1$ with the first group of primary thresholds $PG_1$, element 34A. It also compares the incremental phase-to-phase voltages in the first set of reach point quantities $QSQ_1$ with the first group of secondary thresholds $SG_1$, element 34B. In a similar manner in the second processing branch, the reach calculation module 12 compares the incremental phase voltages in the second set of reach point quantities $QSQ_2$ with the second group of primary thresholds $PG_2$, element 36A, as well as compares the incremental phase-to-phase voltages in the second set of reach point quantities $QSQ_2$ with the second group of secondary thresholds $SG_2$, element 36B. In the Nth processing branch, the reach calculation module 12 compares the incremental phase voltages in the Nth set of reach point quantities $QSQ_N$ with the Nth group of primary thresholds $PG_N$, element 38A, as well as compares the incremental phase-to-phase voltages in the Nth set of reach point quantities $QSQ_N$ with the Nth group of secondary thresholds $SG_N$, element 38B.

The reach calculation module then determines that there is a first type of fault $F_{T1}$ if any threshold in the first group of primary thresholds PG1, in the second group of primary thresholds PG2 or the Nth group of primary thresholds PGN is crossed, element 40A, where in this case there is a phase-to-ground fault in a phase for which the corresponding incremental reach point voltage crosses any of the corresponding thresholds in the N groups. The reach calculation module also determines that there is a second type of fault $F_{T2}$ if any threshold in the first group of secondary thresholds $SG_1$, second group of secondary thresholds $SG_2$ or Nth group of secondary thresholds $SG_N$ is crossed, element 40B, where in this case a phase-to-phase fault is indicated for incremental phase-to-phase voltages that cross any of the corresponding thresholds in the N groups, where again a determination may be made as soon as a threshold is crossed. The thresholds in the group of primary thresholds may additionally have different values than the thresholds in the group of secondary thresholds A threshold for the first type of fault may thus have a different value than a threshold for the second type of fault. It may as an example be higher.

The used cut-off depends on the sampling rate and application requirements. It is for instance to have cut-off frequencies at 100 Hz, 150 Hz, 200 Hz, 300 Hz, 400 Hz, 500 Hz, woo Hz and 2000 Hz.

The protection relay also provides a fast phase selection scheme in which fault types are detected. The phase selection scheme may be preceded by a start-up function, where a certain outcome of processing in the start-up function may trigger the carrying out of the phase selection scheme. Only if the start-up function operates to indicate that there is a fault or disturbance on the power line, the phase selection scheme will be started for detecting the fault types.

Figure 7:
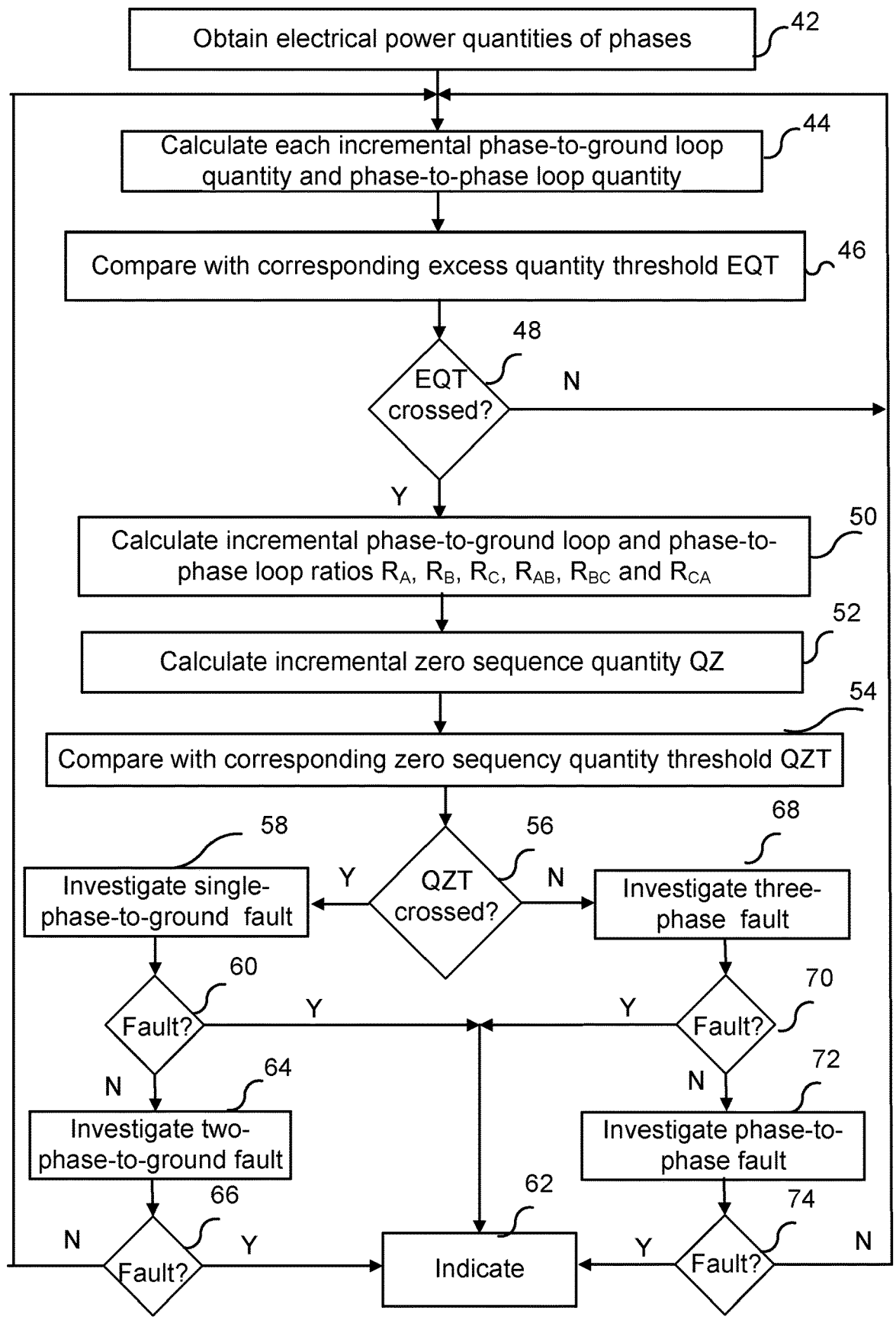

How this may be implemented in the phase selection module 14 will now be generally described with reference to FIG. 7.

The operation is based on the comparison of incremental electrical power line quantities such as current of different loops, where a loop is a phase-to-ground loop or a phase-to-phase loop. The comparison is thus performed for phase-to-ground loops and phase-to-phase loops.

Electrical power line quantities of measured types such as currents i(t) or voltages v(t) are supplied also to the phase selection module 14. The phase selection module 14 thereby obtains electrical power quantities of the different phases, element 42, where the quantities may be of a certain type such as current or voltage.

Thereafter the startup function is initiated. In the startup function each of a number of incremental phase-to-ground loop quantities and each of a number of incremental phase-to-phase loop quantities are compared with corresponding excess quantity thresholds. The phase selection scheme is then performed if any of the excess quantity thresholds are crossed.

The phase selection module 14 thus determines each incremental quantity of the type in phase-to-ground loops and phase-to-phase loops, element 44. The incremental quantity is also in this case the difference between the quantity at a present point in time or time instance t and an earlier point in time or time instance (t−T), where the earlier point in time is a corresponding point in time in a previous period of the quantity.

Each phase-to-ground loop quantity and phase-to-phase loop quantity is then compared with a corresponding excess quantity threshold EQT, element 46, where the corresponding excess quantity threshold EQT may depend on a corresponding average value of the quantity, such as an RMS value, and may possibly also be based on a constant such as on rated current of the current transformer. An excess quantity threshold EQT may as an example be set as:

$$EQT = (K_1 \times I_N + K_2 \times I_{RMS}) \quad (12)$$

where $I_N$ is the rated current of the current transformer, $I_{RMS}$ is the RMS current and $K_1$ and $K_2$ are constants.

If any of these thresholds are not crossed, element 48, incremental quantities are calculated a new for a following time instance of the quantity, element 44, while if any threshold is crossed, element 48, then the phase selection module 14 continues and starts the phase selection scheme.

In the phase selection scheme, the phase selection module 14 calculates ratios $R_A$, $R_B$, $R_C$, $R_{AB}$, $R_{BC}$, $R_{CA}$ of the incremental phase-to-ground loop quantities and the incremental phase-to-phase loop quantities. It thus calculates incremental quantity ratios of the measured electrical power line quantity type in the phase-to-ground loops and phase-to-phase loops of the power line PL, element 50. The calculating of the ratios is thereby preceded by the startup function determining that at least one of the excess quantity thresholds is crossed. The phase selection module 14 thus determines an incremental phase-to-ground loop quantity ratio $R_A$, $R_B$, $R_C$ in each phase as well as an incremental phase-to-phase loop quantity ratio $R_{AB}$, $R_{BC}$, $R_{CA}$ between each phase. A ratio may additionally be determined as a phase-to-ground loop quantity or phase-to-phase loop quantity divided by the lowest of the incremental phase-to-ground loop quantities or phase-to-phase loop quantities respectively. The calculating of the ratios may comprise dividing a phase-to-ground loop quantity by the lowest of the phase-to-ground loop quantities and dividing a phase-to-phase loop quantity by the lowest of the phase-to-phase loop quantities. The incremental phase-to-ground loop quantity ratio of a certain phase may thereby be determined as the incremental phase-to-ground loop quantity of the phase divided with the lowest of the three incremental phase-to-ground loop quantities, while an incremental phase-to-phase loop quantity ratio may be determined as the incremental phase-to-phase loop quantity of a pair of phases divided by the lowest of the incremental phase-to-phase loop quantities. Thereby one incremental phase-to-ground loop quantity ratio and one incremental phase-to-phase loop quantity ratio may always be equal to one.

Furthermore, the ratios $R_A$, $R_B$, $R_C$, $R_{AB}$, $R_{BC}$, $R_{CA}$ are compared with corresponding thresholds and a type of fault is determining based on the comparisons of the ratios. How this may be done will be described in the following.

The module calculates an incremental zero sequence or zero-mode quantity QZ, element 52, which may be the zero sequence of the measured electrical quantity type. The incremental zero sequence quantity QZ is then compared with a zero sequence quantity threshold QZT, element 54, where the threshold is set at a level such that the crossing of it corresponds to the presence of a zero sequence quantity and the non-crossing corresponds to no zero-sequence quantity being present with measurement error and calculation error are also taken into account.

If the threshold QZT is crossed, element 56, then a single-phase-to ground-fault is investigated, element 58, while if the threshold QZT is not crossed, then a three-phase fault is investigated, element 68. In case a single-phase-to ground-fault is determined, element 60, then this is indicated, element 62, while if no single-phase-to ground-fault is determined, element 60, then a two-phase-to-ground fault is investigated, element 64. In case a two-phase-to-ground fault is determined, element 66, then this is indicated, element 62, while if no two-phase-to-ground fault is determined, element 62, then the phase selection module 14 returns and determines incremental quantities anew for the following time instance of the quantity, element 44. If, in the case of investigating a three-phase fault, element 68, a fault is determined, element 70, then this three-phase fault is indicated, element 62. If no three-phase fault is determined, element 70, then a phase-to-phase fault is investigated, element 72. In case a phase-to-phase fault is determined, element 74, then this is indicated, element 62, while if no phase-to-phase fault is determined, element 74, then the phase selection module returns and determines incremental quantities anew for the following time instance of the quantity, element 44.

It can thereby be seen that four types of faults can be determined. As will be shown below also the phases involved in the faults may be determined. This information may then be submitted to the tripping module 16, which may go ahead and trip one or more of the power line phases based on the information.

How the investigation of the different types of faults may be carried out will now be described with reference being made to FIG. 8.

A three-phase fault may be determined if the phase-to-ground loop quantity ratios $R_A$, $R_B$ and $R_C$, are all below a first phase-to-ground loop threshold TPL1 and the phase-to-phase loop quantity ratios $R_{AB}$, $R_{BC}$ and $R_{CA}$ are all below a first phase-to-phase loop threshold TPLL1 and if at the same time all the calculated quantities in all loops have crossed their excess quantity thresholds EQT and the zero-sequence quantity QZ is below the zero sequence quantity threshold QZT, element 76.

A single-phase-to-ground fault may be determined if one of the phase-to-ground loop quantity ratios involving a certain phase is higher than the other phase-to-ground loop quantity ratios and if at the same time the calculated phase-to-ground loop quantity of the above-mentioned certain phase and the calculated phase-to-phase loop quantities involving the same phase have crossed their excess quantity thresholds EQT and the zero-sequence quantity QZ is above the zero sequence quantity threshold QZT, element 78. A single-phase-to-ground fault in phase A would for instance be indicated, if ratio $R_A$ is found to be higher than ratios $R_B$ and $R_C$ and if ratios $R_{AB}$ and $R_{CA}$ are higher than ratio $R_{BC}$.

A two-phase-to-ground fault may be determined if one of the phase-to-ground loop quantity ratios is smaller than the other two phase-to-ground loop quantity ratios and all the phase-to-phase loop quantity ratios are below a second phase-to-phase loop threshold TPPL2, and if at the same time all calculated phase-to-phase loop quantities and the calculated phase-to-ground loop quantities that are related to the other two phase-to-ground loop quantity ratios have crossed their excess quantity thresholds EQT and the zero-sequence quantity QZ is above the zero sequence quantity threshold QZT, element 80. The fault is then indicated for the phases corresponding to the two higher phase-to-ground loop ratios.

A two-phase fault may be determined if two of the phase-to-ground loop quantity ratios are higher than the remaining phase-to-ground loop quantity ratio and all the phase-to-phase loop quantity ratios are smaller than or below the second phase-to-phase loop threshold TPPL2, and if at the same time all calculated phase-to-phase loop quantities and the calculated phase-to-ground loop quantities that are related to the two phase-to-ground loop quantity ratios have crossed their excess quantity thresholds EQT and the zero-sequence quantity QZ is below the zero sequence quantity threshold QZT, element 82.

The phase selection scheme may also be described in the following way. In general, there are mainly three key elements in the scheme: calculating startup element, calculating the ratios of currents and the phase selection logic based on comparing the ratios. Here the calculation of a startup element is the finding that an incremental phase-to-ground loop current or an incremental phase-to-phase loop current crosses a corresponding excess quantity threshold and the phase selection logic is the investigation and indicating the different types of fault.

The elements are the following:

Element 1—Check if the loop gets start-up: Only the loop with start-up signal operates will further be checked if it is the faulted phase. The basic start-up algorithm for each loop may be $$\Delta i(t) > K_1 \times I_N + K_2 \times I_{RMS} \quad (13)$$

Here, $\Delta i(t)$ is the incremental loop current. $I_N$ is the rated current of CT (current transformer). $I_{RMS}$ is the RMS value of the loop current. K1 and K2 are the settings for fixed threshold and floating threshold.

Element 2—Calculate the ratios between different current loops: Proposed scheme is based on current ratios (or called normalized currents) instead of currents. This arrangement makes the calculation both more stable and the setting easier. At the same time, it is also helpful to improve the sensitivity and operation speed. There are 6 ratios defined below. All the currents in the ratio calculation as shown below are RMS values.

$$R_A = \Delta I_A / \min(\Delta I_A, \Delta I_B, \Delta I_C) \quad (14)$$

$$R_B = \Delta I_B / \min(\Delta I_A, \Delta I_B, \Delta I_C) \quad (15)$$

$$R_C = \Delta I_C / \min(\Delta I_A, \Delta I_B, \Delta I_C) \quad (16)$$

$$R_{AB} = \Delta I_{AB} / \min(\Delta I_{AB}, \Delta I_{BC}, \Delta I_{CA}) \quad (17)$$

$$R_{BC} = \Delta I_{BC} / \min(\Delta I_{AB}, \Delta I_{BC}, \Delta I_{CA}) \quad (18)$$

$$R_{CA} = \Delta I_{CA} / \min(\Delta I_{AB}, \Delta I_{BC}, \Delta I_{CA}) \quad (19)$$

where $\Delta I_A$ is the incremental current in phase A, $\Delta I_B$ is the incremental current in phase B, $\Delta I_C$ is the incremental current in phase C, $\Delta I_{AB}$ is the incremental current between phase A and B, $\Delta I_{BC}$ is the incremental current between phase B and C and $\Delta I_{CA}$ is the incremental current between phase C and A. The incremental currents could be calculated based on the measured electrical quantities of a present time instance t and earlier measured electrical quantities of a corresponding time instance (t−T) in a previous period T (T is fundamental power system frequency period time). For example, for phase A incremental current $\Delta I_A$, at present time instant t, can be calculated as below listed in equation (20) and other incremental values could be calculated in the similar way by using the corresponding measured electrical quantities of the respective phases.

$$\Delta I_A(t) = I_A(t) - I_A(t-T) \quad (20)$$

In practical applications, the incremental currents in the ratio calculations may be very small. To make sure the calculation of ratios (division algorithm) is stable, it is required that the absolute value of the denominator (min $(\Delta I_A, \Delta I_B, \Delta I_C)$ or $\min(\Delta I_{AB}, \Delta I_{BC}, \Delta I_{CA})$) in the equations above should be larger than some thresholds. If the denominator is smaller than the threshold, the related calculation results of ratios could be set to a pre-set big value (e.g. 1000) directly to avoid the problem of division by zero.

Element 3—Compare the relative size of the ratios and detect the faulted phases.

A three-phase fault may be detected through:

1. Incremental zero sequence current $\Delta I_o$ is small enough.

$$\Delta I_o < QZT$$

2. All the 6 loop ratios are small enough.

$R_A < TPL1$ & $R_B < TPL1$ & $R_C < TPL1$ & $R_{AB} <$TPPL1 & $R_{BC} <$TPPL1 & $R_{CA} <$TPPL1

3. All 6 loops startup

A single-phase to ground fault in exemplifying phase A may be detected through:

1. Incremental zero sequence current $\Delta I_o$ is large enough $$\Delta I_o > QZT$$

2. Ratios related to phase A are larger than other ratios without phase A involved.

$R_A \geq TPL2$ & $R_B < TPL2$ & $R_C < TPL2$ &
$R_{AB} \geq TPPL2$ & $R_{CA} \geq TPPL2$ & $R_{BC} == 1$ 3. Related loops startup A two-phase-to-ground fault in exemplifying phases B and C may be detected through:
  1. Incremental zero sequence current $\Delta I_o$ is large enough $\Delta I_o > QZT$ 2. $R_A$ is the smallest in the phase-to-ground loop ratios. And the difference among the three phase-to-phase loop ratios are not too big.

$R_A == 1$ & $R_B \geq TPL2$ & $R_C \geq TPL2$ & $R_{AB} < TPPL2$
  & $R_{BC} < TPPL2$ & $R_{CA} < TPPL2$ 3. Related loops startup A phase-to-phase fault between exemplifying phases B and C may be detected through:
  1. Incremental zero sequence current $\Delta I_o$ is small enough $\Delta I_o < QZT$ 2. Ratios of B and C loops are bigger than A loop and the difference among the three phase-to-phase loop ratios are not too big.

$R_A == 1$ & $R_B \geq TPL2$ & $R_C \geq TPL2$ & $R_{AB} < TPPL2$
  & $R_{BC} < TPPL2$ & $R_{CA} < TPPL2$ 3. Related loops startup Some advantages of the proposed fast phase selection scheme are summarized below.

(1) The calculation is based on time domain and no need for calculating the phasors.

(2) Fast speed. The typical operate time is <1 ms for an exemplifying 4.8 kHz sampling rate.

(3) It has high sensitivity even for high impedance faults and high source impedance ratio (SIR) conditions.

The reach calculation module, phase selection module and tripping module may be implemented as one or more hardware modules, such as one or more FPGA modules. As an alternative they may be realized as software modules. They may thus be implemented using computer program code, which may be provided on one or more data carriers which performs the functionality of these modules when the program code thereon is operated upon by one or more processor or being loaded into one or more computers. One such data carrier 84 with computer program code 86, in the form of a CD ROM disc, is schematically shown in FIG. 9. Such computer program may as an alternative be provided on a memory stick. As an alternative the computer program may be provided on a server and downloaded therefrom into the one or more computer.

From the foregoing discussion it is evident that the present invention can be varied in a multitude of ways. It shall consequently be realized that the present invention is only to be limited by the following claims.

The invention claimed is:

1. A method of determining a fault in a protected zone of a power line the method comprising:
  obtaining voltage and current measurements at a measurement point at one end of the power line;
  processing the measurements in a number of parallel processing branches comprising at least two parallel processing branches, wherein the processing in each branch comprises
    obtaining filtered measurements by filtering the measurements in a corresponding low pass filter, wherein cut-off frequencies of the low pass filters in these parallel processing branches differ from each other,
    calculating incremental phase-to-ground loop quantities and incremental phase-to-phase loop quantities from the filtered measurements,
    comparing each of the incremental phase-to-ground loop quantities and incremental phase-to-phase loop quantities to a threshold corresponding to that loop quantity,
    in response to any of the thresholds being crossed, starting a phase selection scheme comprising
      calculating phase-to-ground loop quantity ratios and phase-to-phase loop quantity ratios,
      calculating an incremental zero-sequence quantity, and
      determining a type of fault based on the phase-to-ground loop quantity ratios, the phase-to-phase loop quantities, and the incremental zero-sequence quantity; and
  determining that there is a fault of the determined type within the protected zone of the power line if any of the thresholds corresponding to the loop quantities is crossed in any of the parallel processing branches,
  wherein, in each branch, the thresholds are different than the thresholds in any other branch.

2. The method according to claim 1, wherein the incremental phase-to-ground loop quantities and incremental phase-to-phase loop quantities are calculated in a time domain of incremental reach point quantities for a reach point of the power line.

3. The method according to claim 2, wherein the start of the processing in the parallel branches is made within a time span of 0-100 µs in relation with each other, and the processing in the branches then continues until a fault determination is made.

4. The method according to claim 2, wherein there is a set of thresholds in each branch comprising a group of primary thresholds for a first type of fault.

5. The method according to claim 2, further comprising comparing each of the phase-to-ground loop quantity ratios and phase-to-phase loop quantity ratios with a threshold corresponding to that ratio, and determining the type of fault based on the comparisons of the ratios.

6. The method according to claim 1, wherein the start of the processing in the parallel branches is made within a time span of 0-100 µs in relation with each other, and the processing in the branches then continues until a fault determination is made.

7. The method according to claim 1, wherein there is a set of thresholds in each branch comprising a group of primary thresholds for a first type of fault.

8. The method according to claim 7, wherein the set of thresholds in each branch comprises a group of secondary thresholds for a second type of fault.

9. The method according to claim 8, wherein the first type of fault is a phase-to-ground fault and the second type of fault is a phase-to-phase fault.

10. The method according to claim 9, wherein comparing each of the incremental phase-to-ground loop quantities and incremental phase-to-phase loop quantities to a threshold comprises comparing at least one incremental phase-to-ground loop quantity to a primary threshold in the group of primary thresholds and comparing at least one incremental phase-to-phase loop quantity to a secondary threshold in the group of secondary thresholds.

11. The method according to claim 1, further comprising comparing each of the phase-to-ground loop quantity ratios and phase-to-phase loop quantity ratios with a threshold corresponding to that ratio, and determining the type of fault based on the comparisons of the ratios.

12. The method according to claim 11, wherein calculating the ratios comprises dividing a phase-to-ground loop quantity by the lowest of the phase-to-ground loop quantities and dividing a phase-to-phase loop quantity by the lowest of the phase-to-phase loop quantities.

13. The method according to claim 12, further comprising comparing each of a number of phase-to-ground loop quantities and each of a number of phase-to-phase loop quantities with an excess quantity threshold corresponding to that loop quantity, and determining that at least one of the excess quantity thresholds is crossed.

14. The method according to claim 11, further comprising comparing each of a number of phase-to-ground loop quantities and each of a number of phase-to-phase loop quantities with an excess quantity threshold corresponding to that loop quantity, and determining that at least one of the excess quantity thresholds is crossed.

15. The method according to claim 14, wherein a three-phase fault is determined if the phase-to-ground loop quantity ratios are all below a first phase-to-ground loop threshold and the phase-to-phase loop quantity ratios are all below a first phase-to-phase loop threshold, and if all the incremental phase-to-ground and phase-to-phase loop quantities have crossed their corresponding excess quantity thresholds, and the incremental zero-sequence quantity is below a corresponding zero sequence quantity threshold.

16. The method according to claim 14, wherein a single-phase-to-ground fault is determined if one of the phase-to-ground loop quantity ratios involving a certain phase is higher than the other phase-to-ground loop quantity ratios, and the phase-to-phase loop quantity ratios involving the same phase are also higher than the remaining phase-to-phase loop quantity ratio, and if the incremental phase-to-ground loop quantity of said certain phase and the incremental phase-to-phase loop quantities involving the same phase have crossed their corresponding excess quantity thresholds, and the incremental zero-sequence quantity is above a corresponding zero sequence quantity threshold.

17. The method according to claim 14, wherein a two-phase-to-ground fault is determined if one of the phase-to-ground loop quantity ratios is smaller than two other phase-to-ground loop quantity ratios, and all the phase-to-phase loop quantity ratios are smaller than a corresponding second phase-to-phase loop threshold, and if all incremental phase-to-phase loop quantities and incremental phase-to-ground loop quantities that are related to the two other phase-to-ground loop quantity ratios have crossed their corresponding excess quantity thresholds, and the incremental zero-sequence quantity is above a corresponding zero sequence quantity threshold.

18. The method according to claim 14, wherein a two-phase fault is determined if two of the phase-to-ground loop quantity ratios are higher than a remaining phase-to-ground loop quantity ratio and all the phase-to-phase loop quantity ratios are smaller than a corresponding second phase-to-phase loop threshold, and if all incremental phase-to-phase loop quantities and incremental phase-to-ground loop quantities that are related to the two phase-to-ground loop quantity ratios have crossed their corresponding excess quantity thresholds, and the incremental zero-sequence quantity is below a corresponding zero sequence quantity threshold.

19. A device for determining a fault in a protected zone of a power line, the device being configured to:

obtain voltage and current measurements at a measurement point at one end of the power line;
process the measurements in a number of parallel processing branches comprising at least two parallel processing branches, wherein the processing in each branch comprises
obtaining filtered measurements by filtering the measurements in a corresponding low pass filter, wherein cut-off frequencies of the low pass filters in these parallel processing branches differ from each other,
calculating incremental phase-to-ground loop quantities and incremental phase-to-phase loop quantities from the filtered measurements,
comparing each of the incremental phase-to-ground loop quantities and incremental phase-to-phase loop quantities to a threshold corresponding to that loop quantity,
in response to any of the thresholds being crossed, starting a phase selection scheme comprising
calculating phase-to-ground loop quantity ratios and phase-to-phase loop quantity ratios,
calculating an incremental zero-sequence quantity, and
determining a type of fault based on the phase-to-ground loop quantity ratios, the phase-to-phase loop quantities, and the incremental zero-sequence quantity; and
determine that there is a fault of the determined type within the protected zone of the power line if any of the thresholds corresponding to the loop quantities is crossed in any of the parallel processing branches, wherein, in each branch, the thresholds are different than the thresholds in any other branch.

20. A non-transitory computer-readable medium comprising computer program code configured to cause a processor to, when said computer program code is being operated upon by the processor:
obtain voltage and current measurements at a measurement point at one end of the power line;
process the measurements in a number of parallel processing branches comprising at least two parallel processing branches, wherein the processing in each branch comprises
obtaining filtered measurements by filtering the measurements in a corresponding low pass filter, wherein cut-off frequencies of the low pass filters in these parallel processing branches differ from each other,
calculating incremental phase-to-ground loop quantities and incremental phase-to-phase loop quantities from the filtered measurements,
comparing each of the incremental phase-to-ground loop quantities and incremental phase-to-phase loop quantities to a threshold corresponding to that loop quantity,
in response to any of the thresholds being crossed, starting a phase selection scheme comprising
calculating phase-to-ground loop quantity ratios and phase-to-phase loop quantity ratios,
calculating an incremental zero-sequence quantity, and
determining a type of fault based on the phase-to-ground loop quantity ratios, the phase-to-phase loop quantities, and the incremental zero-sequence quantity; and
determine that there is a fault of the determined type within the protected zone of the power line if any of the thresholds corresponding to the loop quantities is crossed in any of the parallel processing branches, wherein, in each branch, the thresholds are different than the thresholds in any other branch.

* * * * *